(12) United States Patent  
Liang et al.

(10) Patent No.: US 8,345,416 B2  
(45) Date of Patent: Jan. 1, 2013

(54) PORTABLE ELECTRONIC DEVICE WITH INTERFACE PROTECTOR

(75) Inventors: Shi-Xu Liang, Shenzhen (CN); Huan-Chang Chung, Shindian (TW)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 211 days.

(21) Appl. No.: 12/948,869

(22) Filed: Nov. 18, 2010

(65) Prior Publication Data

US 2012/0069499 A1    Mar. 22, 2012

(30) Foreign Application Priority Data

Sep. 20, 2010 (CN) .......................... 2010 1 0287827

(51) Int. Cl.
*H05K 5/00* (2006.01)
*H04M 1/00* (2006.01)

(52) U.S. Cl. ......... 361/679.31; 361/679.32; 361/679.33; 361/679.37; 361/679.38; 361/679.39; 455/575.3

(58) Field of Classification Search .................. 361/678, 361/679.49–679.54, 688–723, 100; 455/575.3, 455/550.1, 56; 248/917–919
See application file for complete search history.

(56) References Cited

U.S. PATENT DOCUMENTS

| | | | |
|---|---|---|---|
| 7,201,407 B2* | 4/2007 | Schlack | 292/139 |
| 7,929,299 B2* | 4/2011 | Li et al. | 361/679.6 |
| 2005/0023838 A1* | 2/2005 | Schlack | 292/66 |
| 2007/0252202 A1* | 11/2007 | Park et al. | 257/335 |
| 2010/0103593 A1* | 4/2010 | Chang et al. | 361/679.01 |

* cited by examiner

*Primary Examiner* — Jayprakash N Gandhi  
*Assistant Examiner* — Jerry Wu  
(74) *Attorney, Agent, or Firm* — Altis Law Group, Inc.

(57) ABSTRACT

Interface protector for an electronic device includes a housing defining an opening exposing the interface; a retaining element defining a first stopping slot and a second stopping slot, the retaining element mounted to the housing by a retaining member; a cover having a protrusion protruding therefrom, the cover rotatably mounted to the retaining element by a rotation member. When the protrusion is received in the first stopping slot, the cover shields the interface; when the protrusion slides out of the first stopping slot, until latching in the second stopping slot, the cover is rotated to expose the interface.

5 Claims, 5 Drawing Sheets

PORTABLE ELECTRONIC DEVICE WITH INTERFACE PROTECTOR

BACKGROUND

1. Technical Field

The exemplary disclosure generally relates to portable electronic devices, particularly to portable electronic devices with external interfaces.

2. Description of Related Art

Modern electronic devices provide a vast array of features that are extremely useful in organizing and communicating information. Moreover, as such devices have evolved, they have become more compact and portable so as to be available whenever and wherever needed. For example, an external interface may be provided on the device for connecting the battery or battery pack to an external power source. Additionally, an external interface might be provided on a wireless telephone to allow the phone to be connected to a laptop or other computer device so that data can be transmitted from the computer over the wireless connection made by the phone.

In all these examples, an electronic device needs an external port, interface, or connector so as to be readily connected electrically to a peripheral device, accessory or network. However, such external interfaces must be protected from the outside elements to continue to function properly. To protect external interfaces, ports and connectors on electronic equipment, it is common to provide a cover that can, for example, be snapped or slid into place over the interface. However, there are a number of drawbacks with these arrangements.

For example, if the cover is completely removable, such as those that snap into place or are otherwise fixed to an electronic device to protect external interface ports and connectors, it is very easy to misplace and lose the cover.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary portable electronic device with a interface protector. Moreover, in the drawings like reference numerals designate corresponding parts throughout the several views. Wherever possible, the same reference numbers are used throughout the drawings to refer to the same or like elements of an embodiment.

DETAILED DESCRIPTION

In this exemplary embodiment, the device is an electronic device such as a mobile telephone but any device to which an interface can be attached is applicable. Accordingly, any reference herein to the mobile telephone should also be considered to apply equally to other portable devices.

Figure 1:
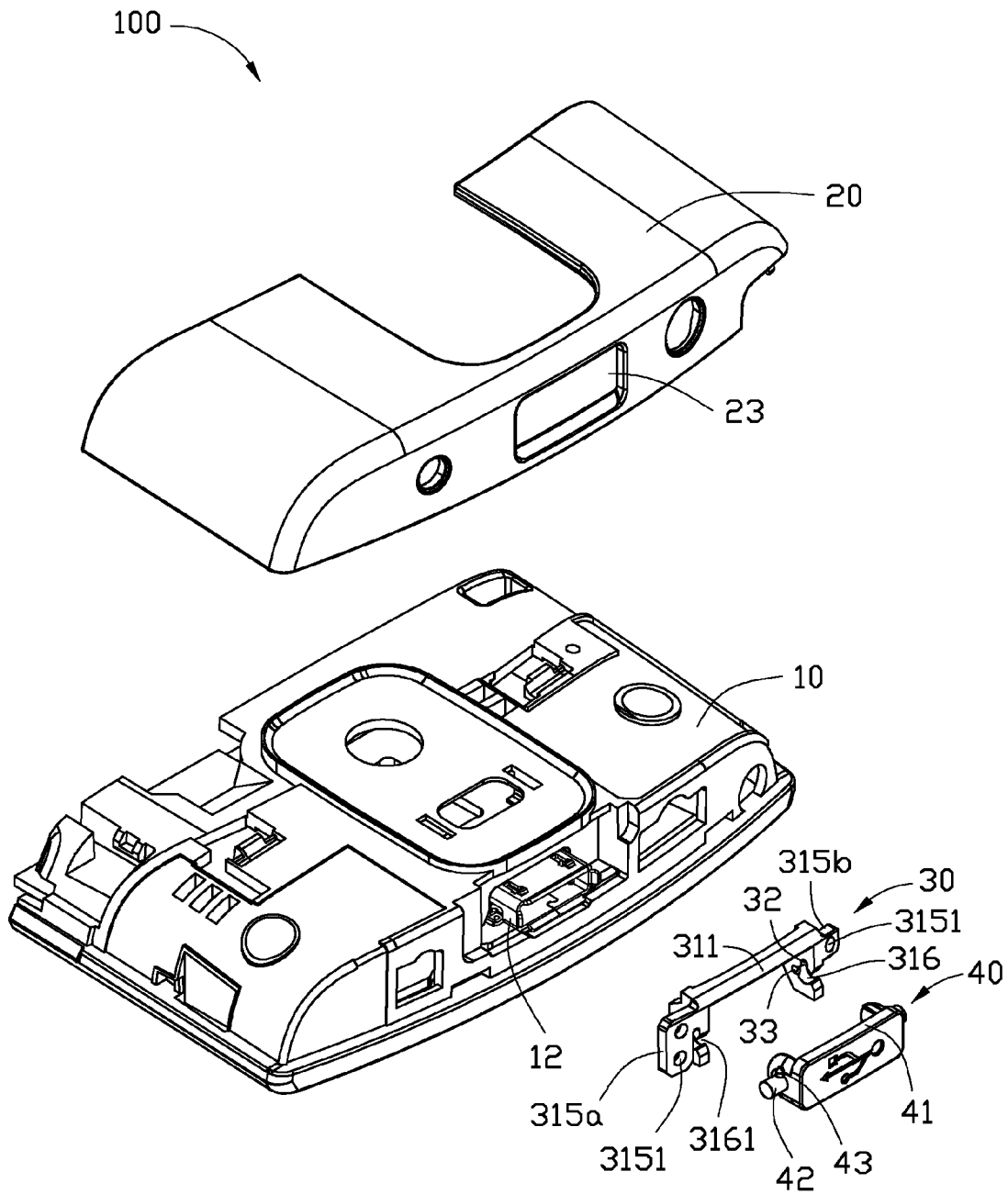
FIG. 1 is an exploded view of an exemplary embodiment of portable electronic device including a main body and interface protector provided by a housing, a retaining element and a cover.
Figure 2:
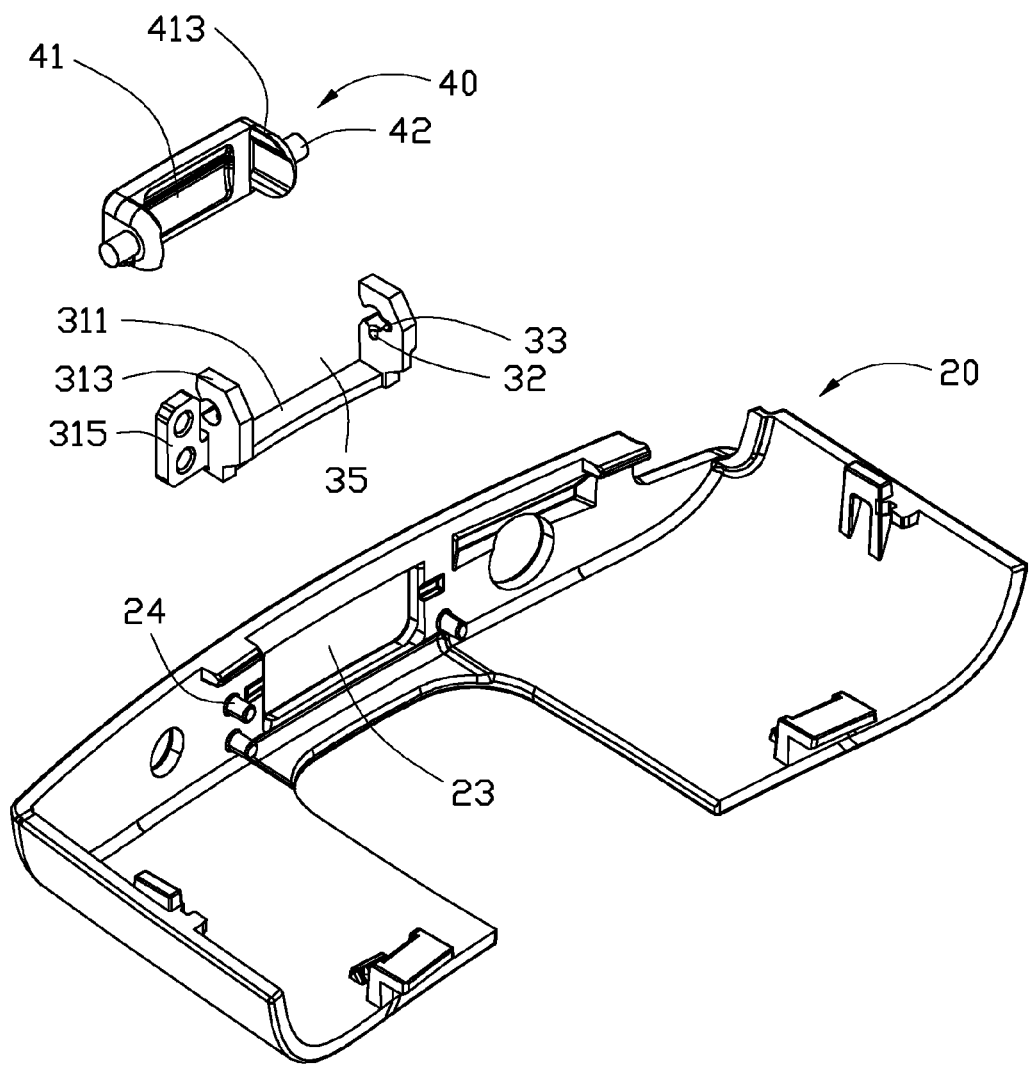
FIG. 2 is an enlarged view of the interface protector of FIG. 1 from another aspect.

Referring to FIGS. 1 and 2, an exemplary portable electronic device 100 includes a main body 10, an interface 12 mounted on the main body 10 and an interface protector (not labeled). The interface 12 may be a power connector or a USB connector. The interface protector includes a housing 20, a retaining element 30 mounted to the housing 20, and a cover 40 rotatably mounted to the retaining element 30. The housing 20 is mounted to the main body 10, and defines an opening 23 aligned with the interface 12. When the housing 20 is mounted to the main body 10, the interface 12 is exposed outwardly from the opening 23. The retaining element 30 includes a connecting bar 311, two opposite mounting boards 313 respectively located near opposite ends of the connecting bar 311, and a retaining board 315a, 315b respectively protruding outwardly from each mounting board 313. The retaining element 30 further defines an open area 35 among the connecting bar 311 and the mounting boards 313. When the retaining element 30 is mounted to the housing 20, the open area 35 is aligned with the opening 23. The cover 40 includes a main board 41 and two sidewalls 413 respectively located at/near opposite ends of the main board 41. The main board 41 is complementary in shape to, but slightly smaller than, the open area 35 of the retaining element 30. The main board 41 is accommodated in the open area 35 to shield the open area 35.

Figure 3:
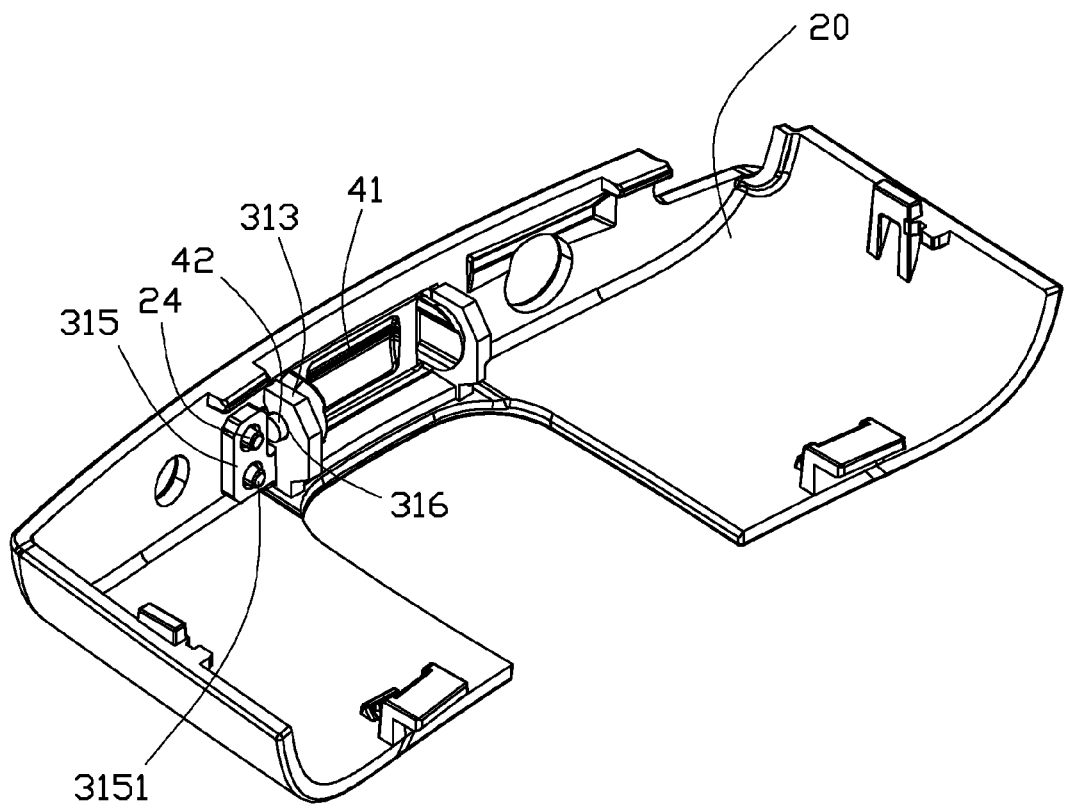
FIG. 3 is an assembled view of the interface protector shown in FIG. 2.

Referring to FIGS. 1-3, the retaining member includes one or more retaining holes 3151 and a corresponding number of retaining poles 24 for retention in the retaining holes 3151. In this exemplary embodiment, the retaining holes 3151 are defined through the retaining boards 315, and the retaining poles 24 are positioned on the housing 20 and received in the retaining holes 3151. Each retaining pole 24 extends into and is fixed, by, for example, hot-melting, in one of the retaining holes 3151, to secure the retaining element 30 to the housing 20. It is understood that the retaining holes 3151 and the retaining poles 24 is but one example of a structure for the retaining member and that other known structures are equally applicable within the scope of this disclosure. It is also understood that the retaining holes 3151 may be defined on either the housing 20 or the retaining element 30 and the retaining hole engaging members (e.g. retaining poles 24) may be carried on the element in which the retaining holes 3151 are not defined.

As previously mentioned, cover 40 is rotatably mounted to retaining element 30. Referring to FIGS. 1-3, a set of shafts 42 rotatably engage a set of shaft holes 316. In this exemplary embodiment, the shaft holes 316 are respectively defined in the mounting boards 313, and the shafts 42 are respectively positioned on the sidewalls 413 and received in the shaft holes 316. Each shaft 42 extends into and is rotatably affixed by, for example, hot-melting in one of the shaft holes 316, so the cover 40 can rotate relative to the retaining element 30 around the shafts 42. It is understood that the shaft holes 316 and the shafts 42 are but one example of a structure capable of rotation and that other known structures are equally applicable within the scope of this disclosure. It is also understood that the shaft holes 316 may be defined on either the cover 40 or the retaining element 30 and the shaft hole engaging members, such as shafts 42 may be carried on the element in which the shaft holes 316 are not defined.

Referring to FIGS. 1-2, the retaining element 30 further includes two slits 3161 respectively defined in the mounting boards 313. Each slit 3161 communicates with a corresponding shaft hole 316, and each shaft 42 is received in a corresponding shaft hole 316 from a corresponding slit 3161. The slits 3161 are smaller than the shafts 42 such that the shafts 42 can not freely slide out of the slits 3161 once fit therein.

Referring to FIGS. 1-2, the interface protector further includes a first stopping slot 32, a second stopping slot 33 and a protrusion 43. The first stopping slot 32 and the second stopping slot 33 are defined in one of the mounting boards 313. The protrusion 43 protrudes from the cover 40. The first stopping slot 32 and the second stopping slot 33 respectively receive the protrusion 43 so that the cover 40 can be stably positioned at different positions, such as those shown in FIGS. 7 and 8.

Referring FIGS. 1 to 4, in assembly, the shafts 42 are received in the shaft holes 316 from corresponding slits 3161 and the main board 41 is accommodated in the open area 35 so the cover 40 is rotatably mounted to the retaining element 30. The retaining poles 24 are respectively retained by, for example, hot-melting in the retaining holes 3151 and the open area 35 aligns with the opening 23 so the retaining element 30 is mounted to the housing 20. The housing 20 is mounted to the main body 10 with the opening 23 aligned with the interface 12.

Figure 4:
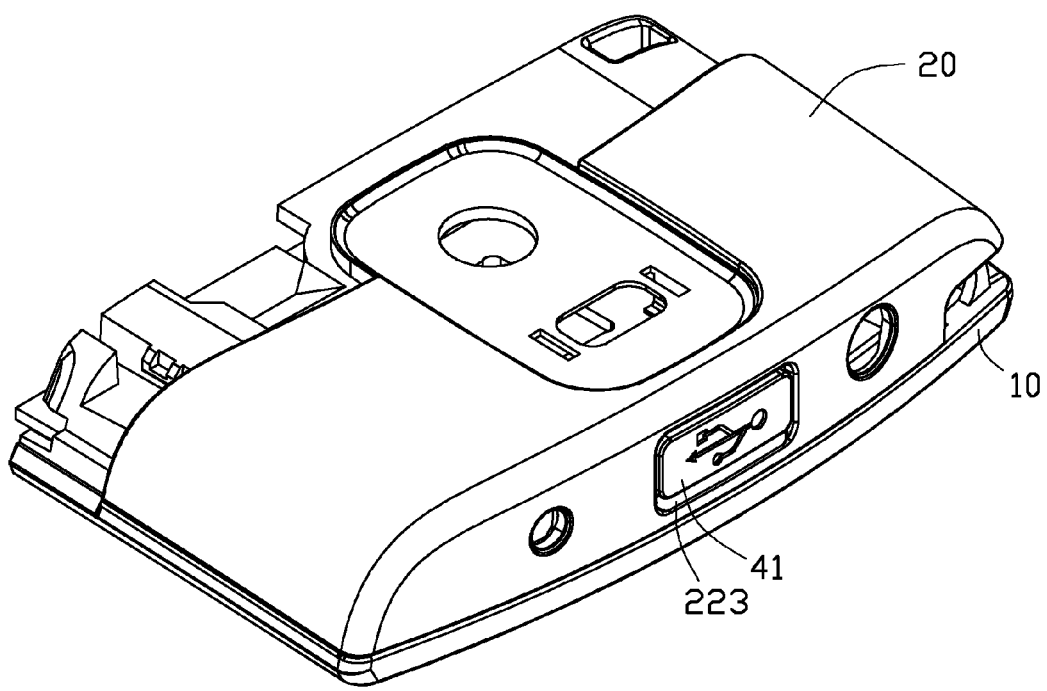
FIG. 4 is an assembled view of the portable electronic device shown in FIG. 1.
Figure 5:
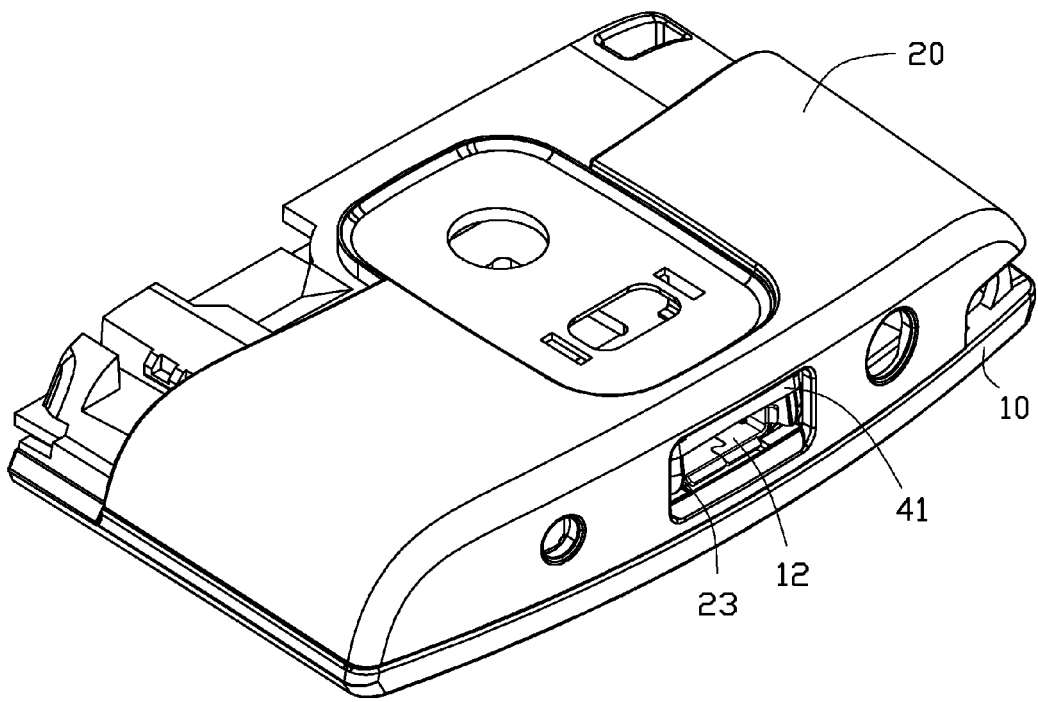
FIG. 5 is a schematic view of the portable electronic device when the cover is open.

Referring to FIGS. 4 to 5, in use, the main board 41 is moved toward the interface 12 with the protrusion 43 sliding out of the first stopping slot 32, until latching in the second stopping slot 33, and the cover 40 is opened to expose the interface 12 as shown in FIG. 5.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An interface protector for protecting an interface, comprising:
    a housing defining an opening for exposing the interface; a retaining element mounted to the housing, the retaining element including a connecting bar, two opposite mounting boards and two retaining boards integrally formed together, each mounting board defining a shaft hole, at least one of the mounting boards defining a first stopping slot and a second stopping slot along peripheral wall of the shaft hole, the first stopping slot and the second stopping slot communicating with a corresponding shaft hole;
    a cover rotatably mounted to the retaining element, the cover including a main board and two sidewalls, a shaft perpendicularly extending from each sidewall, at least one shaft and sidewall having a protrusion protruding therefrom;
    wherein each shaft is rotatably affixed in each corresponding shaft hole, so the cover can rotate relative to the retaining element around the shafts, when the protrusion is received in the first stopping slot, the cover shields the interface; when the protrusion is slid out of the first stopping slot, until the protrusion is latched in the second stopping slot, the cover is rotated into the housing to expose the interface.

2. The interface protector of claim 1, wherein the retaining element defines an open area aligned with the opening, and the open area is defined among the connecting bar and the mounting boards.

3. The interface protector of claim 1, wherein the retaining element further includes two slits respectively defined in the mounting boards; each slit communicates with a corresponding shaft hole thereby each shaft can slide into a corresponding shaft hole from a corresponding slit.

4. A portable electronic device, comprising: a main body having an interface mounted thereon; and an interface protector comprising:
    a housing mounted to the main body, the housing defining an opening for exposing the interface;
    a retaining element including a connecting bar, two opposite mounting boards and two retaining boards integrally formed together, each mounting board defining a shaft hole, at least one of the mounting boards defining a first stopping slot and a second stopping slot along a peripheral wall of the shaft hole, the first stopping slot and the second stopping slot communicating with a corresponding shaft hole, the retaining element mounted to the housing;
    a cover including a main board and two sidewalls, a shaft perpendicularly extending from each sidewall, at least one shaft and sidewall having a protrusion protruding therefrom, the cover rotatably mounted to the retaining element;
    wherein each shaft is rotatably affixed in each corresponding shaft hole, so the cover can rotate relative to the retaining element around the shafts, the first stopping slot and the second stopping slot respectively engage with the protrusion so that the cover is positioned in different positions.

5. The portable electronic device of claim 4, wherein the retaining element defines an open area aligned with the opening.

* * * * *